(12) United States Patent
Markovski et al.

(10) Patent No.: US 11,549,193 B2
(45) Date of Patent: Jan. 10, 2023

(54) METAL-COATED POROUS POLYMERIC STAMP MATERIALS FOR ELECTROCHEMICAL IMPRINTING

(71) Applicants: Jasmina Markovski, Mesa, AZ (US); Aliaksandr Sharstniou, Gilbert, AZ (US); Stanislau Niauzorau, Gilbert, AZ (US); Bruno Azeredo, Scottsdale, AZ (US); Yifu Ding, Superior, CO (US)

(72) Inventors: Jasmina Markovski, Mesa, AZ (US); Aliaksandr Sharstniou, Gilbert, AZ (US); Stanislau Niauzorau, Gilbert, AZ (US); Bruno Azeredo, Scottsdale, AZ (US); Yifu Ding, Superior, CO (US)

(73) Assignees: Arizona Board of Regents on behalf of Arizona State University, Scottsdale, AZ (US); The Regents of The University of Colorado, a Body Corporate, Denver, CO (US)

(*) Notice: Subject to any disclaimer, the term of this patent is extended or adjusted under 35 U.S.C. 154(b) by 0 days.

(21) Appl. No.: 17/173,837

(22) Filed: Feb. 11, 2021

(65) Prior Publication Data
US 2021/0246569 A1 Aug. 12, 2021

Related U.S. Application Data

(60) Provisional application No. 62/972,979, filed on Feb. 11, 2020.

(51) Int. Cl.
C25F 3/12 (2006.01)
C25F 3/14 (2006.01)
(Continued)

(52) U.S. Cl.
CPC .................. *C25F 3/12* (2013.01); *C09D 1/00* (2013.01); *C23C 14/205* (2013.01); *C25F 3/14* (2013.01); *C25F 7/00* (2013.01); *H01L 21/3063* (2013.01)

(58) Field of Classification Search
CPC .. H01L 21/30604; H01L 21/3063; C25F 3/12; C25F 3/14; C25F 7/00
See application file for complete search history.

(56) References Cited

FOREIGN PATENT DOCUMENTS

WO WO-2018140811 A * 8/2018 ........... G03F 7/0002

OTHER PUBLICATIONS

Aghajani et al., "Relationship between permeation and deformation of porous membranes," J. Membr. Sci., 2017, 526: 293-300.
(Continued)

*Primary Examiner* — Nicholas A Smith
(74) *Attorney, Agent, or Firm* — Fish & Richardson P.C.

(57) ABSTRACT

A metal-assisted chemical imprinting stamp includes a porous polymer substrate and a noble metal coating formed directly on the porous polymer substrate. Fabricating the metal-assisted chemical imprinting stamp includes providing a porous polymer substrate, and disposing a noble metal on the porous polymer substrate. Metal-assisted chemical imprinting includes positioning a silicon substrate in an etching solution, contacting a surface of the silicon substrate with a stamp comprising a noble metal layer on a surface of a porous polymer substrate, and separating the silicon substrate from the stamp to yield a pattern corresponding to the noble metal layer on the silicon substrate.

21 Claims, 1 Drawing Sheet

(51) Int. Cl.
*C23C 14/20* (2006.01)
*C09D 1/00* (2006.01)
*C25F 7/00* (2006.01)
*H01L 21/3063* (2006.01)

(56) References Cited

OTHER PUBLICATIONS

Azeredo et al., "Direct Imprinting of Porous Silicon via Metal-Assisted Chemical Etching," Adv. Funct. Mater., 2016, vol. 26., Iss. 17, p. 2929-2939.
Bastide et al., "3D Patterning of Si by Contact Etching With Nanoporous Metals," Front. Chem., Apr. 25, 2019, 7(256):1-13.
Heinz et al., "Surface-patterning of polymeric membranes: fabrication and performance," Curr. Opin. Chem. Eng., 2018, 20: 1-12.
Huang et al., "Metal-Assisted Chemical Etching of Silicon: A Review," Adv. Mater., 2011, vol. 23, Iss. 2, p. 285-308.
J. Zhang et al., "Electrochemical nanoimprint lithography: when nano imprint lithography meets metal assisted chemical etching," Nanoscale, 2017, 9: 7476-7482.
Ki et al., "Chemical Imprinting of Crystalline Silicon with Catalytic Metal Stamp in Etch Bath," ACS Nano, 2018, 12(1):609-616.
Li et al., "Uniform Vertical Trench Etching on Silicon with High Aspect Ratio by Metal-Assisted Chemical Etching Using Nanoporous Catalysts," ACS Appl. Mater. Interfaces, 2014, vol. 6, Iss. 1, p. 575-584.
Niauzorau et al., "Fabrication of nanocomposites based on silicon nanowires and study of their optical properties," Phys. Status Solidi C, Feb. 2016, 13(4):146-150.
Sharstniou et al., "Electrochemical nanoimprinting of silicon," PNAS, May 21, 2019, 116(21):10264-10269.
Torralba et al., "3D patterning of silicon by contact etching with anodically biased nanoporous gold electrodes," Electrochem. Commun., 2017, 76:79-82.

* cited by examiner

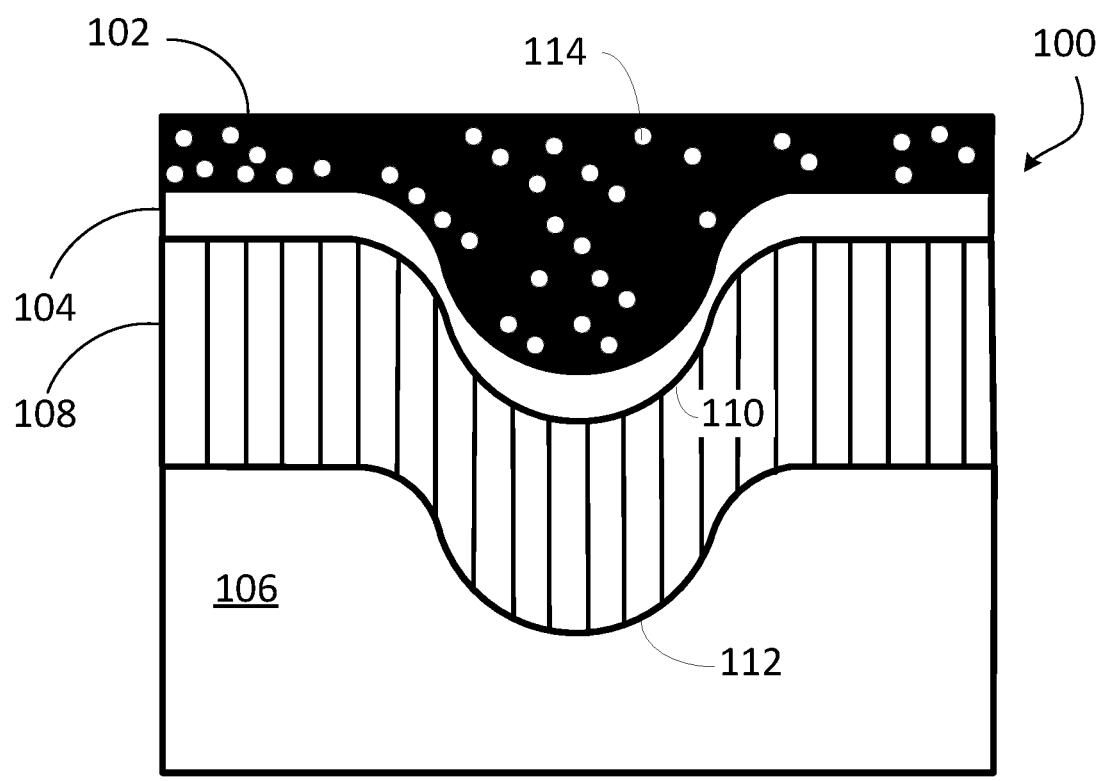

METAL-COATED POROUS POLYMERIC STAMP MATERIALS FOR ELECTROCHEMICAL IMPRINTING

CROSS-REFERENCE TO RELATED APPLICATION

This application claims the benefit of U.S. Patent Application No. 62/972,979 filed on Feb. 11, 2020, which is incorporated herein by reference in its entirety.

STATEMENT OF GOVERNMENT INTEREST

This invention was made with government support under 1264276 awarded by the National Science Foundation. The government has certain rights in the invention.

TECHNICAL FIELD

This invention relates to metal-coated micro-, meso-, and macroporous polymeric stamp materials suitable for electrochemical nanoimprinting.

BACKGROUND

In metal-assisted chemical etching (MACE), noble metal nanoparticles, such as Au and Ag, are deposited onto a surface of a semiconductor substrate. The semiconductor substrate is immersed into an etching solution containing an acid and an oxidizing agent. The oxidizing agent reduces on the surface of the nanoparticles, resulting in the generation of charge carriers (holes), which are further injected into the semiconductor substrate. The holes lead to oxidation and subsequent dissolution of the semiconductor by the acid. The reaction confinement results at least in part from the competition between two processes: (i) the rate of hole generation and injection and (ii) the rate of hole consumption (i.e., semiconductor dissolution). Balancing these processes can result in fast and well-confined etching. However, since MACE involves mass transport (i.e., movement of reactants toward and products away from the reaction areas), the etching fidelity can be suppressed by solution depletion in the case of catalytic particles with large areas (>100×100 nm).

SUMMARY

Polymeric stamp materials for metal-assisted chemical imprinting (Mac-Imprint) are described. These materials are fully porous (i.e., the porosity extends throughout the thickness of the material) and thus support greater storage volume and a diffusion pathway to the bulk of the etchant solution. Due at least in part to the (i) interconnected pore structure and (ii) precise control over the stamp pore size in the sub-100 nm range, these materials allow Mac-Imprint of nano—as well as microscale features (e.g., in silicon) with high patterning fidelity and greater depths.

In a first general aspect, a metal-assisted chemical imprinting stamp includes a porous polymer substrate and a noble metal coating formed directly on the porous polymer substrate.

Implementations of the first general aspect include one or more of the following features.

The porous polymer substrate is resistant to hydrofluoric acid and hydrogen peroxide. The porous polymer substrate defines pores having a pore size between about 5 nm and about 50 nm. The porous polymer substrate includes polyethersulfone. The porous polymer substrate defines pores having a pore size between about 100 nm and about 2 µm. The porous polymer substrate includes polyvinylidene fluoride. The noble metal coating includes gold or silver. A thickness of the noble metal coating is in a range of about 10 nm to about 50 nm.

In a second general aspect, fabricating a metal-assisted chemical imprinting stamp includes providing a porous polymer substrate and disposing a noble metal on the porous polymer substrate.

Implementations of the second general aspect may include one or more of the following features.

Disposing the noble metal layer on the porous polymer substrate can include sputtering the noble metal on the porous polymer substrate.

In a third general aspect, metal-assisted chemical imprinting includes positioning a silicon substrate in an etching solution, contacting a surface of the silicon substrate with a stamp comprising a noble metal layer on a surface of a porous polymer substrate, and separating the silicon substrate from the stamp to yield a pattern corresponding to the noble metal layer on the silicon substrate.

Implementations of the third general aspect may include one or more of the following features.

The silicon substrate is a silicon wafer. The noble metal layer includes nanometer-scale features. A thickness of the noble metal layer is in a range between about 10 nm and about 50 nm. The porous polymer substrate defines pores having a pore size in a range from about 5 nm to about 2 µm.

In some implementations, the etching solution includes an electrolyte. A counter electrode can be in contact with the etching solution. The noble metal layer can be externally electrically biased against the electrolyte with the counter electrode. A constant voltage or constant current can be applied to the counter electrode. The noble metal layer can function as a working electrode.

Advantages of materials and methods described herein include an average pore diameter of polymeric membranes as large as 5 µm and as small as 5 nm, which contributes to improved reactant diffusion and therefore facilitates large area imprinting uniformity. Smaller pore sizes are desirable to minimize the roughness of the imprinted features if that is undesirable for the application.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIG. 1 depicts mass-transport during metal-assisted chemical imprinting (Mac-Imprint).

DETAILED DESCRIPTION

Metal-assisted chemical imprinting (Mac-Imprint) is a contact-based wet etching process that combines metal-assisted chemical etching (MACE) and nanoimprint lithography (NIL). Mac-Imprint processes can be used for semiconductor patterning with arbitrary and complex 3D micro- and nanostructures. While porous catalytic metal thin-films can be used to reduce limitations with etching fidelity, this approach has several drawbacks: (i) the smallest pattern feature size is restricted by pore diameter, and (ii) high surface area of porous catalytic films leads to excessive hole generation and injection, resulting in semiconductor porosification outside contact areas. Moreover, the thickness of the porous catalyst layer is also a limiting factor for reducing reactant depletion and improving etchant storage. Thus, the scalability of Mac-Imprint can be restricted by the limited mass-transport of the reactants towards a catalytic metal coated stamp-substrate contact interface. Several approaches have been implemented to promote diffusion through interconnected porous networks embedded into either substrate or in the catalyst thin layer of the stamp. However, these approaches are unable to sustain large area patterning on blank wafers and etching of deeper features (e.g., >1 µm) due at least in part to limited volume for etchant storage at the micrometric gaps between stamp and substrate.

This disclosure describes polymeric stamp materials for metal-assisted chemical imprinting (Mac-Imprint). These materials are fully porous (i.e., the porosity extends throughout the thickness of the material) and thus support greater storage volume and a diffusion pathway to the bulk of the etchant solution. Due at least in part to the (i) interconnected pore structure and (ii) precise control over the stamp pore size in the sub-100 nm range, these materials allow Mac-Imprint of nano—as well as microscale features (e.g., in silicon) with high patterning fidelity and greater depths.

FIG. 1 is a cross-sectional view of Mac-Imprint stamp 100 including porous polymer membrane 102 with catalytic layer 104. Stamp 100 can be fabricated in dimensions up to 12 inches wide. Stamp 100 is positioned over substrate 106, with etchant solution 108 shown between catalytic layer 104 and substrate 106. Protrusion 110 in stamp 100 forms recession 112 in substrate 106 when substrate 106 is contacted with catalytic layer 104 of stamp 100 during Mac-Imprint.

Porous polymer membrane 102 serves as a mass-transport enabling backing stamp material, and facilitates scalability and large-area nano- and micropatterning and texturization of semiconductors. Pores 114 in porous polymer membrane 102 typically have a size in a range between about 5 nm and about 100 µm. A thickness of the polymer membrane is typically between about 50 µm to 200 µm, with overall porosity ranges between about 50% and about 85%. Although pores 114 are interconnected, FIG. 1 depicts pores 114 as discrete for simplicity.

Suitable polymers for porous polymer membrane 102 include those available as porous membranes with high chemical stability, ability to be patterned by a variety of techniques, and developed and interconnected pore structure. In particular, suitable polymers are (i) resistant to etchants such as HF and $H_2O_2$, and (ii) suitable for nano- and micropatterning and texturization. Examples include polyethersulfone (PES) (pore size between about 5 nm and about 50 nm) and polyvinylidene fluoride (PVDF) (pore size between about 100 nm and about 2 µm). Other examples of polymers with similar pore size range include polysulfone (Psf), polypropylene (PP), polyacryloniltrile (PAN), and polytetrafluoroethylene (PTFE).

Nano-to-micro scale porosity of the stamps allow solution infiltration and subsequent exchange of reactant species at the etching interface, thereby promoting diffusion which leads to uniform imprinting over large areas.

Protrusions 110 are formed in porous polymer membrane 102 by a process including thermal embossing, nanoimprint lithography, phase inversion micromolding, and soft lithography combined with thermally induced phase separation. Dimensions of protrusions 110 are typically in a range of 5 nm to 100 µm.

Catalytic layer 104 is a non-porous layer of a catalytic metal. Here, a "non-porous" layer refers to a layer that is not intentionally porous. Suitable examples of catalytic metals include gold, iron, copper, nickel, platinum, palladium, and rhodium. Catalytic layer 104 can be deposited onto porous polymer layer 102 using methods such as magnetron sputtering, chemical vapor deposition, plasma enhanced chemical vapor deposition, atomic layer deposition, molecular beam epitaxy, electron beam evaporation, and laser beam evaporation. A thickness of catalytic layer 104 is typically in a range of 10 nm to 400 nm.

Substrate 106 is typically a semiconductor substrate. Suitable materials for substrate 106 include silicon, germanium, gallium, arsenic, and any combination thereof. Substrate 106 can be single crystalline, polycrystalline, or amorphous. Substrate 106 can have dimensions up to 300 mm in diameter.

Etchant solution 108 is typically combination of fluoride-containing etchant (e.g., 48 vol % hydrofluoric acid) and an oxidizing agent (e.g., 30 vol % hydrogen peroxide, potassium permanganate). Etchant solution 108 can include an undiluted acid and an oxidizing agent, or be diluted with deionized water or solvent (e.g., an alcohol, such as isopropanol or ethanol). The ratio between an acid and oxidizing agent can vary from 1:70 to 70:1 (by volume), based at least in part on the desired etching reaction rate and confinement.

In some implementations, the etching solution includes an electrolyte. A counter electrode can be in contact with the etching solution. The noble metal layer can be externally electrically biased against the electrolyte with the counter electrode. A constant voltage or constant current can be applied to the counter electrode. The noble metal layer can function as a working electrode.

The implementation of porous polymer-based Mac-Imprint stamps allows large area uniform patterning (e.g., up to 5×5 $cm^2$) of blank semiconductors (i.e., without pre-patterning) with densely packed defect-free 3D features. A tip-to-tip distance can range from about 10 nm to about 300 µm, with a size ranging from about 5 nm to about 100 µm. Large area imprinting is facilitated by mass-transport through a bicontinuous porous polymer network and defect-free feature patterning is controlled through hole generation and injection rate suppression comparing to stamps with a porous catalytic layer. Here, "bicontinuous porous polymer network" generally refers to a polymer network in which pores and polymer ligaments are interconnected. Patterning resolution is related to the porosity of the membrane and can be as low as 5 nm.

Materials and methods described herein allow low-cost scalable surface nano- and micropatterning and texturization of amorphous, poly-, and single crystalline semiconductors. Wafer-scale Mac-Imprint of bare silicon wafers can yield functional optical elements such as antireflective coatings, diffraction gratings, and parabolic concentrators. More generally, suitable applications include optoelectronics (visible and near-IR range antireflective surfaces, self-cleaning surfaces), silicon photonics (photonic crystals, waveguides and ring resonators, metasurfaces), and nano- and microelectromechanical systems.

Advantages of materials and methods described herein include an average pore diameter of polymeric membranes as large as 1 µm and as small as 5 nm, which contributes to improved reactant diffusion and therefore facilitates large area imprinting uniformity. Smaller pore sizes are desirable to minimize the roughness of the imprinted features if that is undesirable for the application.

EXAMPLES

Commercially available water filtration membranes made of polyvinylidene fluoride (PVDF) and two types of polyethersulfone (PES) with pore sizes from 0.1-2 μm for PVDF, <10 nm and 20-50 nm for PES1 and PES-A14, respectively, were obtained from University of Colorado Boulder. The PVDF membrane surface was not patterned. The PES membranes were patterned with periodic gratings using thermal embossing micromolding.

Porous membrane cleaning was performed sequentially in acetone, isopropyl alcohol (IPA), and deionized (DI) water. Si cleaning was performed in an aqueous solution of ammonium hydroxide and hydrogen peroxide (RCA-1) at 70° C. during 15 min followed by thorough rinsing with DI water. Clean PVDF and PES membranes were covered with 10 nm Cr adhesive layer and 20 nm Au catalytic layer using NSC-3000 magnetron sputter. After sputtering, membranes were cut into square pieces and mounted onto equal-sized precleaned Si chips to form Mac-Imprint stamps.

The Mac-Imprint system used includes a LabVIEW-controlled XYZ-positioning system, a load cell, and an electrochemical cell. Stamps were connected to the load cell through polytetrafluoroethylene (PTFE) rod using SU-8 2015 photoresist as an etchant-resistant glue. Stamps are brought in parallel plate-to-plate contact with the Si on the bottom of the electrochemical cell at a desired load in a presence of etching solution. After sufficient contact time, stamps are moved away from the Si chip, leaving Mac-Imprinted patterns on the surface. Finally, Si chips are thoroughly washed in IPA and DI water.

The imprinted features were examined by optical, SEM, and AFM microscopy along with Raman spectroscopy and compared to that of the used PPM stamps. Optical and scanning electron microscope (SEM) images of porous polymer based Mac-Imprint stamps and imprinted silicon chips, as well as 3D surface nano- and microtexturization show that imprinted surfaces have a pattern width and periodicity matching that of the porous polymer membrane patterns. Moreover, it was observed that implementation of the PVDF-based stamps resulted in the imprinting of the antireflective random nanotip arrays caused by the pore size of the used membranes.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A metal-assisted chemical imprinting stamp comprising:
   a porous polymer substrate; and
   a nonporous noble metal coating formed directly on the porous polymer substrate.

2. The stamp of claim 1, wherein the porous polymer substrate is resistant to hydrofluoric acid and hydrogen peroxide.

3. The stamp of claim 1, wherein the porous polymer substrate defines pores having a pore size between about 5 nm and about 50 nm.

4. The stamp of claim 3, wherein the porous polymer substrate comprises polyethersulfone.

5. The stamp of claim 1, wherein the porous polymer substrate defines pores having a pore size between about 100 nm and about 2 μm.

6. The stamp of claim 5, wherein the porous polymer substrate comprises polyvinylidene fluoride.

7. The stamp of claim 1, wherein the nonporous noble metal coating comprises gold or silver.

8. The stamp of claim 1, wherein a thickness of the nonporous noble metal coating is in a range of about 10 nm to about 50 nm.

9. A method of fabricating the metal-assisted chemical imprinting stamp of claim 1, the method comprising:
   providing the porous polymer substrate; and
   disposing the nonporous noble metal coating on the porous polymer substrate.

10. The method of claim 9, wherein disposing the nonporous noble metal coating on the porous polymer substrate comprises sputtering the noble metal on the porous polymer substrate.

11. A method of metal-assisted chemical imprinting, the method comprising:
    positioning a silicon substrate in an etching solution;
    contacting a surface of the silicon substrate with the metal-assisted chemical imprinting stamp of claim 1; and
    separating the silicon substrate from the stamp to yield a pattern corresponding to the nonporous noble metal coating on the silicon substrate.

12. The method of claim 11, wherein the silicon substrate is a silicon wafer.

13. The method of claim 11, wherein the nonporous noble metal layer coating comprises nanometer-scale features.

14. The method of claim 13, wherein a thickness of the nonporous noble metal coating is in a range between about 10 nm and about 50 nm.

15. The method of claim 11, wherein the porous polymer substrate defines pores having a pore size in a range from about 5 nm to about 2 μm.

16. The method of claim 11, wherein the etching solution comprises an electrolyte.

17. The method of claim 16, further comprising a counter electrode in contact with the etching solution.

18. The method of claim 17, further comprising externally electrically biasing the nonporous noble metal coating against the electrolyte with the counter electrode.

19. The method of claim 18, further comprising applying a constant voltage or constant current to the counter electrode.

20. The method of claim 19, wherein the nonporous noble metal layer coating functions as a working electrode.

21. The stamp of claim 1, wherein the porous polymer substrate comprises polysulfone, polypropylene, polyacrylonitrile, or polytetrafluoroethylene.

* * * * *